United States Patent [19]
Hsueh

[11] Patent Number: 5,763,830
[45] Date of Patent: Jun. 9, 1998

[54] STRUCTURE AND CONNECTION FOR HOUSING ACTIVE COMPONENTS IN A MODULAR-REPLACEABLE INNER CONTAINER FOR CABLE TELEVISION SIGNAL TRANSMISSION

[75] Inventor: Chien-Ping Hsueh, Chang-Hua Hsien, Taiwan

[73] Assignee: Transystem, Inc., Hsinchu, Taiwan

[21] Appl. No.: 732,840

[22] Filed: Oct. 15, 1996

[51] Int. Cl.$^6$ ........................................ H02G 3/18
[52] U.S. Cl. ........................ 174/60; 174/51; 174/261; 439/581; 403/22; 403/393; 411/551; 361/799; 361/818; 361/753
[58] Field of Search .................. 174/59, 60, 51, 174/50, 65 R, 260, 261, 267; 439/63, 581, 76.1; 403/22, 393, 384; 411/551, 550; 361/799, 800, 801, 816, 818, 752, 753, 759, 796

[56] References Cited

U.S. PATENT DOCUMENTS

| | | |
|---|---|---|
| 3,989,333 | 11/1976 | Cauldwell .................. 439/76.1 |
| 4,138,179 | 2/1979 | Miller et al. ................ 439/63 |
| 4,780,570 | 10/1988 | Chuck ...................... 361/818 X |
| 4,990,109 | 2/1991 | Romerein et al. ............. 439/63 X |
| 4,995,815 | 2/1991 | Buchanan et al. ............. 439/581 X |
| 5,291,376 | 3/1994 | Mills ........................ 361/752 X |
| 5,336,113 | 8/1994 | Chanteau ..................... 439/581 |
| 5,532,659 | 7/1996 | Dodart ....................... 439/63 X |

FOREIGN PATENT DOCUMENTS

| | | | |
|---|---|---|---|
| 2500175 | 7/1976 | Germany | 439/581 X |
| 2700232 | 7/1978 | Germany | 439/581 X |
| 5-136578 | 6/1993 | Jordan | 174/51 X |

*Primary Examiner*—Bot L. Ledynh
*Assistant Examiner*—Dean A. Reichard
*Attorney, Agent, or Firm*—Bo-In Lin

[57] ABSTRACT

The present invention discloses an inner module container provided for containing active circuit elements for processing and transmitting cable television signals receivable from and transmissible through pins of coaxial cables. The inner module container includes direct access openings for receiving coaxial cable pins for securely connecting to the active circuit elements whereby the pins of the coaxial cables are connected to the active circuit elements without requiring a separate connector outside of the inner module container. In a preferred embodiment, the active circuit elements further include mechanisms for locking coaxial cable pins for directly and securely locking to the coaxial cable pins. In a specific embodiment, each of the mechanisms for locking coaxial cable pins includes a threaded screw attached to an upper plate and a lower plate for perpendicular screwing and horizontal locking, wherein the threaded screw is for perpendicularly tightening or loosening and horizontally rotating the lower plate to a locking or unlocking stop position and for perpendicularly tightening or loosening the locking plate from the coaxial cable pins for directly and securely locking and to conveniently unlock the active circuit elements from the coaxial cable pins.

11 Claims, 6 Drawing Sheets

5,763,830

1

STRUCTURE AND CONNECTION FOR HOUSING ACTIVE COMPONENTS IN A MODULAR-REPLACEABLE INNER CONTAINER FOR CABLE TELEVISION SIGNAL TRANSMISSION

BACKGROUND OF THE INVENTION

1. Field of the Invention

This invention relates generally to apparatus and method of cable television signal transmission. More particularly, this invention relates to an improved apparatus and method for housing the active components for cable television signal transmission in a modular replaceable container such that better electrical contact, more reliable long term performance and lower cost of signal transmission can be achieved.

2. Description of the Prior Art

Problems of reliability and degraded performance in cable television signal transmission are often experienced when a signal transmission box implements an inner module to contain active components used for television signal transmission. These problems are generally caused by a "quick replacement" requirement for this inner module. In order to satisfy this quick-replacement requirement, electrical and mechanical contacts specially designed using "a plug-and-pull" type of connections are commonly employed. These plug-and-pull quick-replacement types of connections often become degraded or damaged after repeated replacements over long-term continuous operation. Reliability and performance of cable-TV signal transmission are adversely affected due to these technical difficulties.

For a transmission box used for cable-TV signal transmission, a special inner module is employed to contain active components for signal processing in order to satisfy a requirement that once malfunction of cable-TV signal transmission occurs which most likely happens to one of the active components, the problem can be quickly corrected by replacing the entire inner module without delay. The more time consuming processes in identifying the defective components and then replacing or repairing the defective components can be performed "off-line" later without affecting on-line cable-TV signal transmission. By replacing the entire inner module with a quick replacement operation, the cable-TV down-time can be minimized under the circumstances that an active component is damaged or begins to malfunction. It is important that this quick replacement requirement be satisfied due to the considerations that these containers, e.g., a transmission box, employed for housing the components used for cable television (Cable-TV) are commonly installed in an outdoor environment When subject to out-door conditions, e.g., the great ranges of variations in temperature, humidity, and dust contents, the active components, employed for processing and transmission of high frequency signals, usually have higher performance and precision requirements. These active circuit components are structurally and functionally more delicate, thus may often be degraded or damaged during outdoor operations. Furthermore, as these outdoor containers are installed in locations not easily reached, on-site repair for these defective components becomes very difficult A most practical way to overcome the difficulties is to include the more vulnerable active components in an easily replaceable module, e.g., an inner module. When a signal transmission problem occurs, an effective and expeditious way to correct the problem is to replace the entire inner module quickly without requiring other time consuming or complicated on-site operations.

2

FIG. 1A is an exploded perspective view of a conventional outer housing 10 for a cable-TV transmission box for containing an inner module 50 therein. The inner module 50 includes a printed circuit board (PCB) 60 for supporting the active components thereon (the active components include a plurality of circuit elements which are not shown for the sake of simplicity of illustration). The outer housing 10 includes access ports 15 with a female threaded coupler allowing a pin of the central conductor from a coaxial cable for carrying the cable-TV signals and a line-voltage to insert into the outer housing 10 for connecting to the active components supported on the PCB 60. The outer housing 10 further includes a plurality of outer connector assemblies 20. Each outer connector assembly 20 includes a plurality of locking connectors 25 for securely attaching to coaxial cable pins inserted from the access ports 15. The locking connector 25 typically includes a threaded locking screw to securely lock to a coaxial cable pin. The outer connector assembly 20 further includes a quick plug-and-pull connector 30 while the inner module 50 includes an interface plugging adapter 55 corresponding to the quick plug-and-pull connector 30. The inner module 50 can then be conveniently connected to and disconnected from the outer connector assembly 20 by plugging into or pulling out from the quick plug-and-pull connector 30 in applying the interface plugging adapter 55 as a means for electrical connection. A commonly available plug-and-pull type of connector for radio-frequency (RF) application is an F-type connector. The quick plug-and-pull connector 30 is electrically connected to the locking connector 25 for electrically connecting to the coaxial cable for transmitting the cable-TV signals and the line-voltage to the active components supported on the PCB 60. FIG. 1B shows a perspective view of the outer housing 10 when the outer connector assemblies 20 are installed on the bottom surface inside the housing structure. A typical cable television signal transmission box of this type is Model No. JLX-7450C produced by General Instrument (GI) Company.

Problems of contact reliability are experienced, especially for the electric contacts between the quick plug-and-pull connector 30, such as an F-type connector, and the interfacing plugging adapter 55. In a contact configuration described above, as the line voltage is also carried through the contacts, larger currents, e.g., currents greater than 10 amperes, are transmitted through these contacts which generates high temperatures thus inducing oxidation and corrosion which further cause the contacts to degrade and eventually lead to damages to the contacts or the active components.

In order to prevent the problems caused by large currents flowing through the outer connector 30 and the interface plugging adapter 55, an improved connection configuration is employed where a bypass power line 70 is used to separately carry the current as that shown in FIG. 2. A typical cable television signal transmission box of this type is Model No. MT-567-H113B3 produced by C-Core Company. The power line 70 is typically connected through a fuse box including a plurality of fuses to protect the quick replacement plug-and-pull type of connectors such that damages to these connectors due to current spikes can be prevented. The fuse box and associated circuit add to the volume of the housing structure of the cable television signal transmission box. The likelihood of broken fuses further increases the inconvenience in requiring more frequent fuse replacements in this type of transmission box.

Even with protection features, a total solution to the technical difficulties discussed above is not provided by a signal transmission box implemented with bypass power line 70 as that shown in FIG. 2. As that shown in FIGS. 1 and 2, the cable television signal transmission box 10 implemented with a bypass power line still has the vulnerable weak points where a quick plug-and-pull connector 30, e.g., an F-type connector, is connected to the inner module through a plugging adapter. Damages or degraded connections may cause malfunction of the signal transmission box when repeated plug-and-pull actions are applied to the outer connector 30 and the plugging adapter for the purpose of replacing the inner module.

Therefore, a need still exists in the art of cable television signal transmission for a new housing structure with improved connection configuration wherein the weak points resulting from applying the quick plug-and-pull type of connections can be eliminated without affecting the convenience and ease of inner module replacement such that the difficulties encountered in the art can be resolved.

SUMMARY OF THE PRESENT INVENTION

It is therefore an object of the present invention to provide a novel housing structure with improved connection configuration to the pin of coaxial cable for a cable television signal transmission box where the vulnerable weak points resulting from employing the quick plug-and-pull type of connection for connecting to the pin of coaxial cable for transmitting the cable television signals can be eliminated such that the aforementioned difficulties and limitations in the prior art can be overcome.

Specifically, it is an object of the present invention to provide a novel housing structure with improved connection configuration to the pin of coaxial cable for a cable television signal transmission box where the pin of the coaxial cable is directly and securely connected to a printed circuit board by a threaded locking connector such that the outer connector is eliminated and the problems caused by the quick plug-and-pull type of connector employed for the outer connector in the prior art can be totally eliminated.

Another object of the present invention is to provide a novel housing structure with improved connection configuration to the pin of coaxial cable for a cable television signal transmission box where a box of an inner module is provided with access openings to allow the pin of the coaxial cable to be directly connected to a print circuit board through these access openings whereby better and more secure connections can be achieved.

Another object of the present invention is to provide a novel housing structure with improved connection configuration to the pin of coaxial cable for a cable television signal transmission where each of the pins of the coaxial cable is securely locked to the PCB by a novel threaded locking connector such that an operator can easily tighten or loosen the pins of the coaxial cable to and from the PCB for installing or removing the inner module as a total unit without complicated maneuvering and delay.

Another object of the present invention is to provide a novel housing structure with improved connection configuration to the pin of coaxial cable for a cable television signal transmission box where a box of an inner module is provided with access openings to allow the pins of the coaxial cable to be directly connected to a print circuit board through these access openings such that the outer connector is eliminated and the size of the cable television signal transmission box can be reduced.

Another object of the present invention is to provide a novel housing structure with improved connection configuration to the pin of coaxial cable for a cable television signal transmission box where a box of an inner module is provided with access openings to allow the pins of the coaxial cable to be directly connected to a print circuit board (PCB) through these access openings such that manufacture and maintenance costs of the cable television signal transmission box can be reduced with simpler structure and less requirements of frequent replacements and repairs.

Briefly, in a preferred embodiment, the present invention includes an inner module container provided for containing circuit means for processing and transmitting cable television signals receivable from and transmissible through pins of coaxial cables. The inner module container includes direct access openings for receiving coaxial cable pins for securely connecting to the circuit means whereby the pins of the coaxial cables are connected to the circuit means without requiring a separate connector outside of the inner module container. In a preferred embodiment, the circuit means further includes means for locking coaxial cable pins for directly and securely locking to the coaxial cable pins. In a specific embodiment, each of the means for locking coaxial cable pins includes a means for perpendicular screwing and horizontal locking, which further includes a threaded screw for horizontally rotating a locking plate to a locking or unlocking stop position and for perpendicularly tightening or loosening the locking plate from the coaxial cable pins for directly and securely locking the coaxial cable pins to the circuit means.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
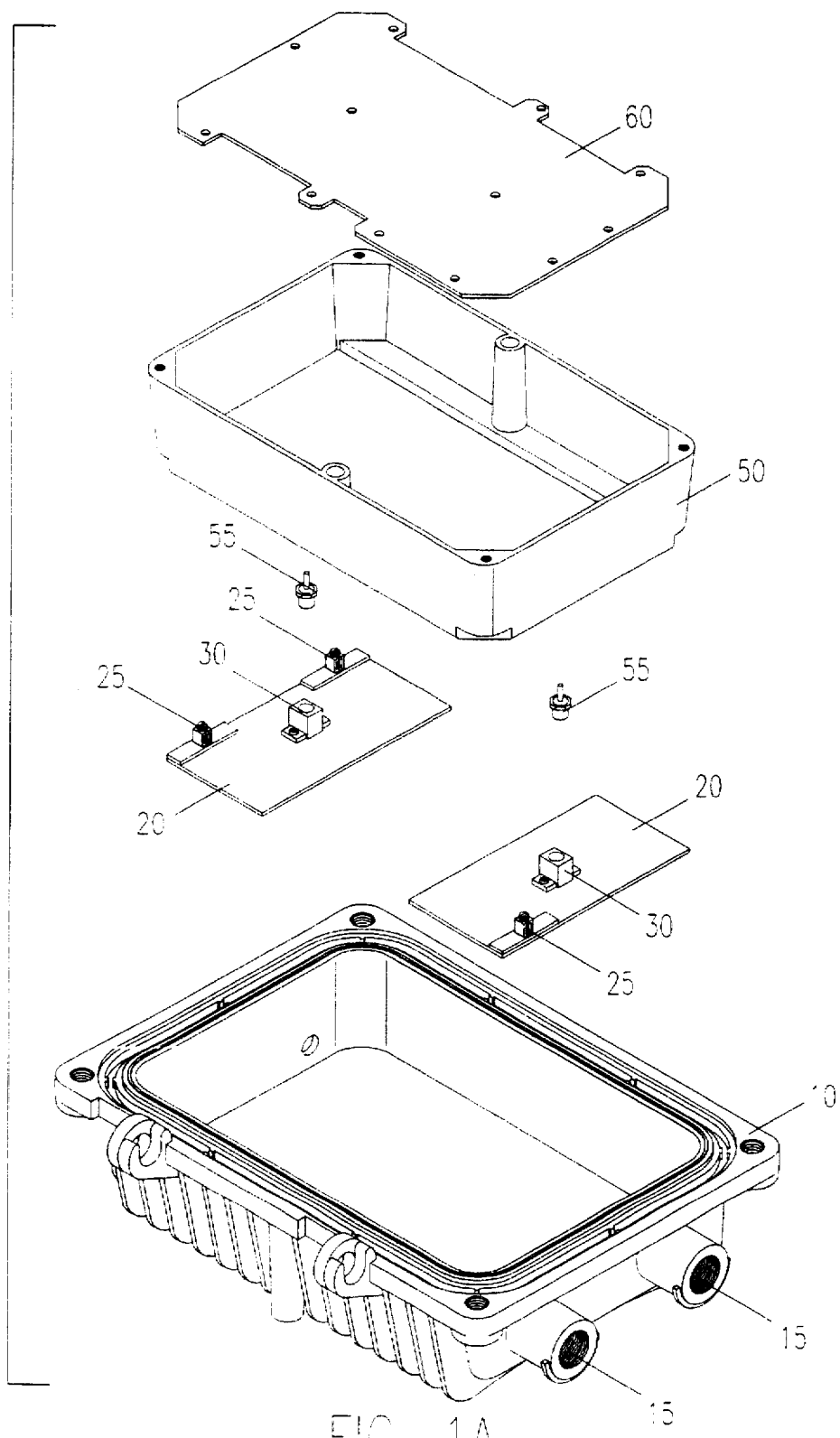
FIGS. 1A and 1B are exploded and integrated perspective views respectively of a conventional cable television signal transmission box including an outer connector interconnecting the coaxial cable pins and an inner module.
Figure 1B:
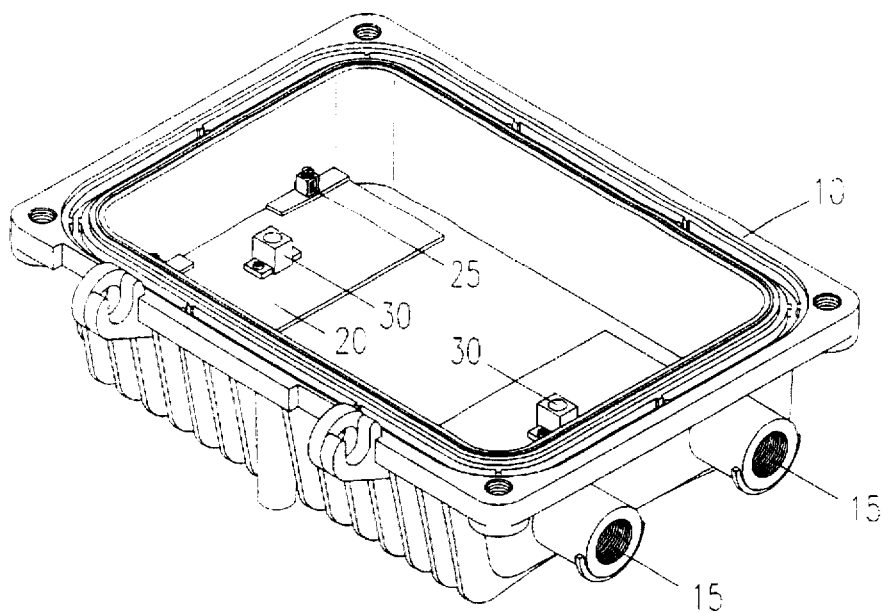
Figure 2:
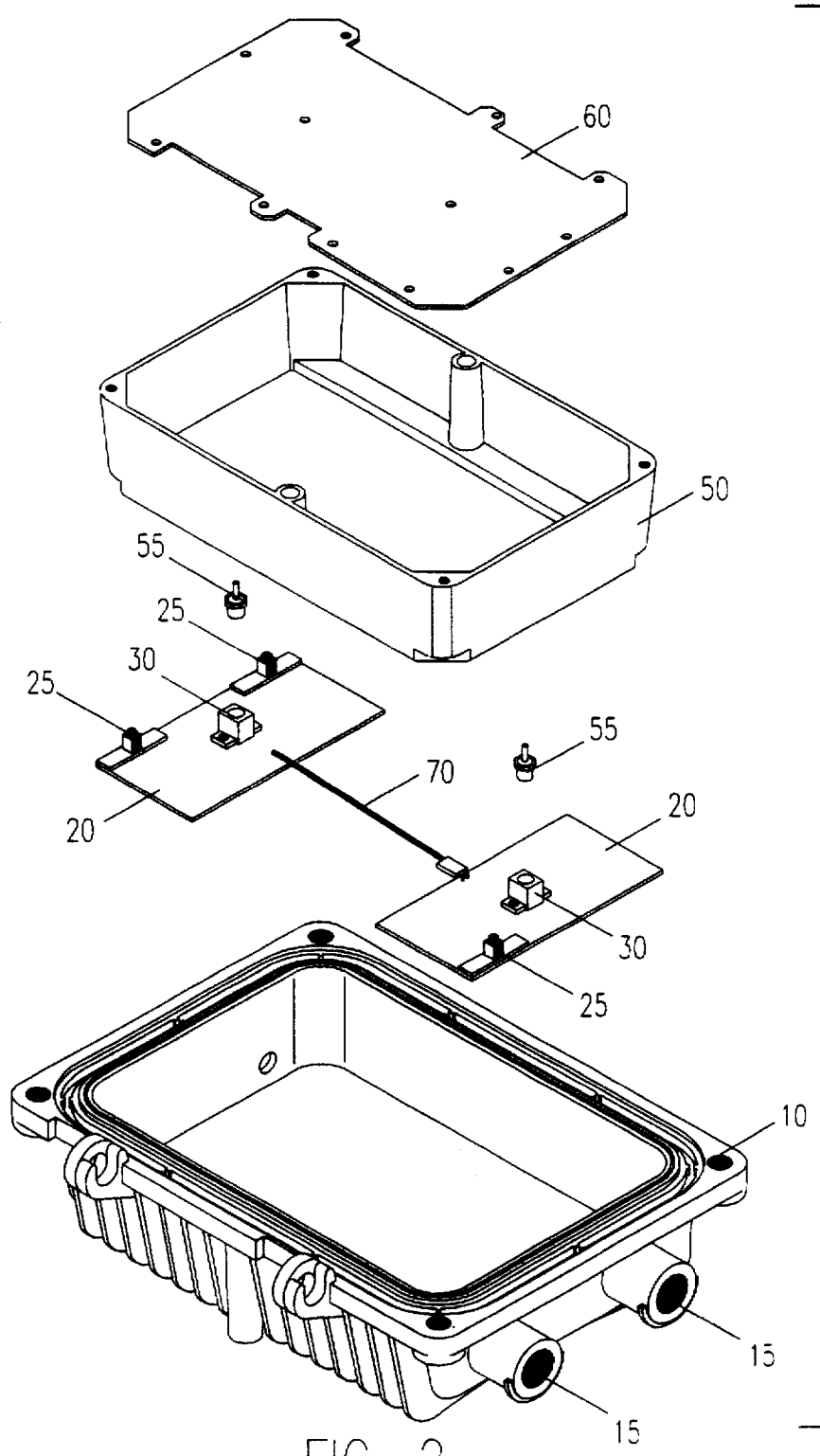
FIG. 2 is an exploded perspective views of an improved conventional cable television signal transmission box including an outer connector, a bypass power line and an inner module.
Figure 3:
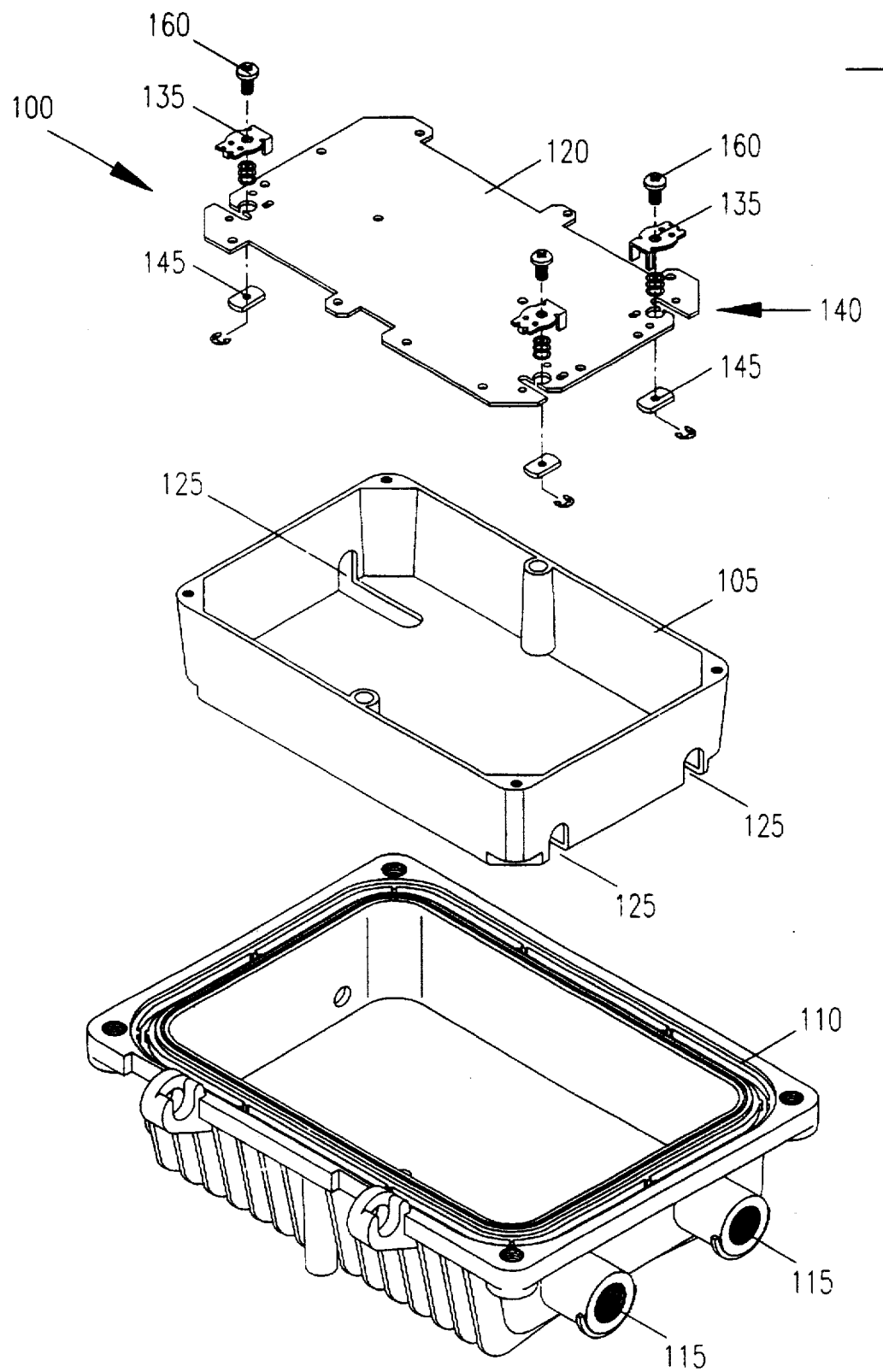
FIG. 3 shows an exploded perspective view of a cable television signal transmission box of the present invention where the external connector is eliminated and the coaxial cable pins are attached directly to the inner module.

FIG. 3 is an exploded perspective view of a cable television signal transmission box 100 of the present invention which includes an outer housing 110 for housing an inner module 105 in which are employed the active components of the cable-TV transmission box 100. The inner module 105 includes a printed circuit board (PCB) 120 for supporting the active components thereon (the active components include a plurality of circuit elements which are not shown for the sake of simplicity of illustration). The outer housing 110 includes access ports 115 with a female threaded coupler allowing a pin of the central conductor from a coaxial cable for carrying the cable-TV signals and a line-voltage to insert into the outer housing 110 for connecting to the active components supported on the PCB 120. Unlike the outer housing 10 of the prior art, as that shown in FIGS. 1 and 2, the outer connector assemblies 20 are eliminated. Instead, the inner module 105 is provided with a plurality of access openings 125 for each coaxial cable pin. The coaxial cable pins are inserted through the access openings 125 and extend to the edge of the printed circuit board PCB 120. Corresponding to each access opening, the printed circuit board includes a plurality of coaxial cable pin slots 130 to receive the pins therein. The inner module further includes a plurality of cable pin locking means 140 to lock the coaxial cable pins in the pin slots 130 thus securely attaching the pins to the PCB 120.

For those of ordinary skill in the art, the novel structure of the inner module 105 having access openings 125 for the coaxial cable pins to connect directly with the printed circuit board 120 can be flexibly implemented in various types of signal transmission boxes which requires an inner module for quick replacement when a malfunction occurs to an active circuit component for signal transmission or processing. Because of the direct connection between the coaxial cable pins and the active circuit elements supported on the printed circuit board, higher performance level can be achieved by the active circuit elements to achieve higher quality signal processing and transmission functions. The transmission box can be a housing structure for an amplifier, coupler, splitters, power inserters, taps, etc. The sizes and shapes of the inner modules can vary but the structure features with the novel connection configuration can be conveniently implemented to improve the reliability of the device, the convenience of repair and maintenance, the performance of the signal transmission and also to achieve a lower cost of transmission box manufacture.

The coaxial cable pin locking means 140 is an assembly which provides a mechanism for perpendicular screwing/unscrewing and horizontally locking/unlocking. The coaxial cable pin locking means 140 includes an upper plate 135, a lower plate 145 wherein each includes a threaded through hole thus allowing a threaded screw 160 to thread therethrough for tightening or loosening the upper plate 135 to or from the lower plate lower plate 145 for locking or unlocking the coaxial cable pin from the PCB board 120. The upper plate 135 further includes lower plate stopper 150 which stops the lower plate 145 at an unlocking position when the screw 160 is turned to a loosening direction, e.g., counter-clockwise direction, and stops the lower plate at a locking position when the screw 160 is turned to a tightening direction, e.g., clockwise direction. Thus, the upper plate 135 equipped with the lower plate stopper 150 and the lower plate 145 provide a means for perpendicular screwing and horizontal locking or unlocking of the coaxial cable pin to and from the PCB board 120. Once the lower plate 145 is rotated by turning the screw 160 to an unlocking position, usually less than a half turn, the lower plate 145 is rotated to a position where the coaxial pin is no longer locked to the PCB board 120 and the inner module 105 can be lifted up and removed from the outer housing 110 for repair or maintenance. A perpendicular screwing action of the threaded screw 160 actuates a horizontal rotation of the lower plate 145 which accomplishes the locking or unlocking of the coaxial cable pin in an efficient, convenient and secure method to lock and unlock the pin to and from the inner module 105. Being securely stopped by the stopper 150, the threaded screw 160 can also be conveniently and precisely tightened according to a torque specification as required by the design and operation conditions to assure high quality contacts are established between the coaxial cable pins and the circuit elements supported on the PCB board 120. Reliability of operation and convenience of removal and repair/maintenance are achieved with a locking means 140 taught by the present invention.

Figure 3A:
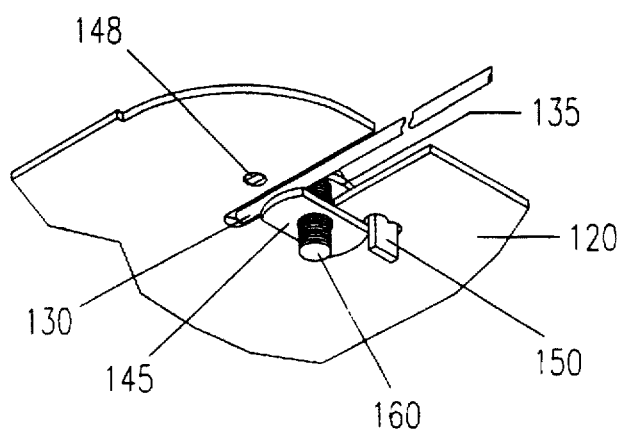
FIGS. 3A and 3B show a perspective assembled and dissembled means for locking coaxial cable pins to a printed circuit board respectively.
Figure 3B:
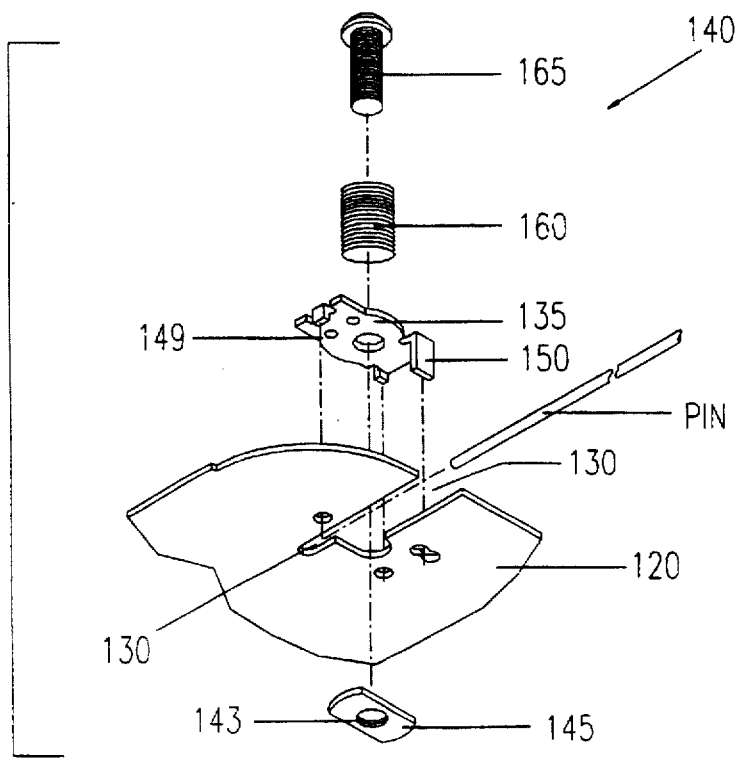

For more details, refer to FIGS. 3A and 3B for assembled and disassembled perspective views respectively of a preferred embodiment of the means 140 for locking the coaxial cable pins to the print circuit board (PCB) 120. The means for locking 140 includes an upper plate 135, a lower plate 145, each having a threaded through hole to receive a threaded screw 160 in which a pin 165 is inserted to turn the threaded screw 160 therethrough. The lower plate 145 rotates horizontally when the threaded screw 160 is screwing or unscrewing perpendicularly between the upper plate 135 and the lower plate 145 to tighten or loosen the lower plate 145 from the upper plate 135. A special lower plate stopper 150 is provided as part of the upper plate 135 which extends through a hole on the PCB 120 to stick out from the bottom of the PCB 120. The lower plate stopper 150 is situated to limit the rotation of the lower plate 145 such that it can only rotate ninety degrees in a either clockwise or counter-clockwise direction. Therefore, when the threaded screw 160 is rotated in a clockwise direction, the lower plate 145 is rotated to a locking position and stopped in a locking position locking the coaxial cable pins. The lower plate stopper 150 stops the movement of the lower plate 145 to allow the threaded screw 160 to continue its action in tightening the lower plate 145 perpendicularly to the upper plate 135. Conversely, when the threaded screw 160 is rotate counter-clockwise to loosen the lower plate 145 from the upper plate 135, the lower plate 145 is rotated horizontally to an open unlocking position and stopped by the lower plate stopper 150. The coaxial cable pin is now unlocked and the inner module 105 shown in FIG. 3 can be freely removed by perpendicularly lifting the whole module 105 from the pin. The means 140 for locking and unlocking the coaxial cable pin to and from the PCB thus provide a convenient way to lock and quick way to unlock the pin to and from the PCB by employing the lower plate stopper 150 and taking advantage of the perpendicular screwing of the threaded screw 160 and horizontal rotation of the lower plate 145.

Figure 4:
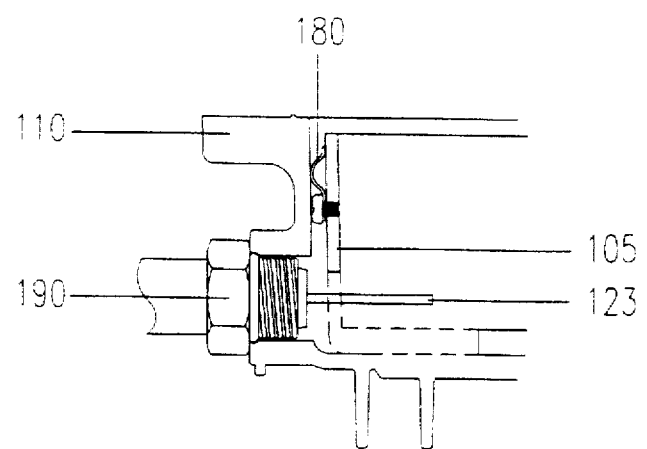
FIG. 4 is a partial cross sectional view of a ground contact disposed between an inner module and an outer housing structure for providing the ground voltage to the circuit elements supported on the PCB.

For the purpose of cable-television signal processing and transmission, the inner module 105 is commonly composed of conductive materials, e.g., a metallic container for containing and supporting the printed circuit board therein. The inner module 105 further serves another important function to provide a ground voltage. In this novel inner module structure and connection configuration, special ground contact means are provided on the outer surface of the module container to establish good ground contact with the outer housing structure. Please refer to FIG. 4 for a partial cross sectional view of the contact between the inner module 105 and the outer housing structure 110. The inner module 105 includes the access openings to allow the coaxial cable pins 123 to enter therein where the coaxial cable 190 is attached to the access ports of the outer housing 110. The inner module 105 further includes a spring contact means 180 which is disposed near the access opening 125 for establishing good ground contact. The ground voltage near the access opening 125 thus provides excellent shielding and de-coupling effects for signal transmission from the coaxial cable pins 123 to the active circuit elements supported on the printed circuit board 120 shown in FIG. 3.

In summary, this invention discloses a replaceable inner module container 105 provided for containing circuit means for processing and transmitting signals receivable from and transmissible through pins 123 of coaxial cables 190. The inner module container 105 includes direct access openings 125 for receiving coaxial cable pins 123 for securely connecting to the circuit means whereby the pins 123 of the coaxial cables 190 are connected to the circuit means without requiring a separate connector outside of the inner module container. The circuit means further includes means 140 for locking coaxial cable pins 123 for directly and securely locking to the coaxial cable pins 123. Each of the means 140 for locking coaxial cable pins 123 comprising a means for perpendicular screwing and horizontal locking, which further includes a threaded screw 160 for horizontally rotating a locking plate 145 to a locking or unlocking stop position and for perpendicularly tightening or loosing a the locking plate 145 from the coaxial cable pins 123 for directly and securely locking the circuit means to the coaxial cable pins 123. The inner module container 105 further includes ground contact means 180 disposed on an outer surface of the inner module 105 for contacting an outer housing structure 110 for containing the inner module therein. The ground contact means 180 on the outer surface of the inner module 105 is disposed near the access openings 125 whereby shielding and de-coupling effects are provided by a ground contact between the ground contact means 180 and the outer housing structure 110.

This invention further discloses a pin locking and unlocking means 140 for locking and unlocking a pin to and from a board 120 with a pin-slot 130 to receive the pin therein. The pin locking and unlocking means 140 includes an upper element 135 for covering the pin-slot 130 over a first surface of the board 120. The pin locking and unlocking means further includes a lower plate 145 for covering the pin-slot 130 over a second surface of the board 120 wherein the lower plate 145 includes a lower plate engaging means, i.e., the threaded hole 148. The upper element 135 further including a perpendicular threaded screwing and unscrewing means 160 for engaging the lower plate engaging means 148 for tightening or loosening the lower plate 145 to and from the upper element 135 and for simultaneously rotating the lower plate 145 horizontally thus covering or uncovering the pin-opening 130 over the second surface. The pin locking and unlocking means further includes a lower plate stopping means 150 disposed on the second surface of the board 120 and securely attached thereto for stopping the lower plate 145 in a locking position covering the pin-slot 130 when the threaded screwing and unscrewing means 160 tightens the lower plate 145 to the upper element 135 and in a an unlocking position uncovering the pin-opening 130 when the threaded screwing and unscrewing means 160 loosens the lower plate 145 from the upper element 135. In a preferred embodiment, the upper element 135 further includes an upper plate 135 with a threaded through hole 148 for covering the pin-slot 130 over the first surface of the board 120.

Therefore, a novel housing structure with improved connection configuration to the pin of coaxial cable for a cable television signal transmission box is disclosed in this invention. The vulnerable weak points resulting from employing the quick plug-and-pull type of connection for connecting to the pin of coaxial cable for transmitting the cable television signals are eliminated. The difficulties and limitations in the prior art are resolved. Specifically, in this novel housing structure implemented with improved connection configuration, the pin of the coaxial cable is directly and securely connected to a printed circuit board by a threaded locking connector such that the outer connector is eliminated and the problems caused by the quick plug-and-pull type of connector employed for the outer connector in the prior art are totally eliminated. This is accomplished by providing an inner module which includes access openings to allow the pin of the coaxial cable to be directly connected to a printed circuit board through these access openings whereby better and more secure connections can be achieved. Additionally, each of the pins of the coaxial cable is securely locked to the PCB by a novel threaded locking connector such that an operator can easily tighten or loosen the pins of the coaxial cable to and from the PCB for installing or removing the inner module as a total unit without complicated maneuvering and delay. Furthermore, by implementation of this novel housing structure and connection configuration, the size of the cable television signal transmission box can be reduced because the outer connectors and the associated circuit connections can be eliminated. Finally, by implementation of this a novel housing structure with improved connection configuration where an inner module is provided with access openings to allow the pins of the coaxial cable to be directly connected to a printed circuit board (PCB) through these access openings, the costs of manufacture and repair/maintenance for the cable television signal transmission box can be reduced with simpler structure and less requirements of frequent replacements and repairs.

Although the present invention has been described in terms of the presently preferred embodiment, it is to be understood that such disclosure is not to be-interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A coaxial cable terminal comprising an outer container enclosing a replaceable inner module container which contains circuit means for processing and transmitting signals receivable from and transmissible through a plurality of coaxial cable pins, said inner module container comprising:

direct access openings for receiving said coaxial cable pins which pass through from said outer container such that said coaxial cable pins directly contact said circuit means without requiring a separate connector mounted on said outer container outside of said inner module container.

2. The terminal of claim 1 wherein:

said circuit means further includes means for locking said coaxial cable pins for directly and securely locking said coaxial cable pins to said circuit means.

3. A replaceable inner module container which contains circuit means for processing and transmitting signals receivable from and transmissible through a plurality of coaxial cable pins, said inner module container comprising:

direct access openings for receiving said coaxial cable pins which pass through from an outer container such that said coaxial cable pins directly contact said circuit means without requiring a separate connector mounted on said outer container outside of said inner module container;

said circuit means further includes means for locking said coaxial cable pins for directly and securely locking said coaxial cable pins to said circuit means;

each of said means for locking said coaxial cable pins comprises a means for vertical screwing and horizontal locking, which further includes a threaded screw for vertical screwing or unscrewing while horizontally rotating a locking plate to a locking or an unlocking stop position respectively for locking or unlocking said coaxial cable pins to and from said circuit means contained in said inner module.

4. The inner module container of claim 3 further comprising:

ground contact means disposed on an outer surface of said inner module container for contacting said outer container which contains said inner module container and for providing a ground voltage to said inner module container.

5. The inner module container of claim 4 further wherein:

said ground contact means on said outer surface of said inner module container is disposed near said access openings whereby shielding and de-coupling effects are provided by a ground contact between said ground contact means and said outer container.

6. A replaceable inner module container which contains circuit means for processing and transmitting signals receivable from and transmissible through a plurality of coaxial cable pins, said inner module container comprising:

direct access openings for receiving said coaxial cable pins which pass through from an outer container such that said coaxial cable pins directly contact said circuit means without requiring a separate connector mounted on said outer container outside of said inner module container;

said circuit means further includes means for locking said coaxial cable pins for directly and securely locking said coaxial cable pins to said circuit means;

each of said means for locking coaxial cable pins comprising a means for vertical screwing and horizontal locking, which further includes a threaded screw for vertical screwing or unscrewing while horizontally rotating a locking plate to a locking or unlocking stop position respectively for locking or unlocking said coaxial cable pins to and from said circuit means contained in said inner module container;

ground contact means disposed on an outer surface of said inner module container for contacting said outer container for containing said inner module container therein; and said ground contact means on said outer surface of said inner module container is disposed near said access openings whereby shielding and de-coupling effects are provided by a ground contact between said ground contact means and said outer container.

7. A pin locking and unlocking means for locking and unlocking a pin to and from a board with a pin-opening to receive said pin therein, the pin locking and unlocking means comprising:

an upper element for covering said pin-opening over a first surface of said board;

a lower plate for covering said pin-opening over a second surface of said board wherein said lower plate includes a lower plate engaging means;

said upper element further including a vertical threaded screwing and unscrewing means for engaging said lower plate engaging means for tightening or loosening said lower plate to and from said upper element and for simultaneously rotating said lower plate horizontally thus covering or uncovering said pin-opening over said second surface; and a lower plate stopping means disposed on said second surface of said board and securely attached thereto for stopping said lower plate in a locking position covering said pin-opening when said threaded screwing and unscrewing means tightens said lower plate to said upper element and in an unlocking position uncovering said pin-opening when said threaded screwing and unscrewing means loosens said lower plate from said upper element.

8. The pin locking and unlocking means of claim 7 wherein:

said upper element further includes an upper plate with a threaded through hole for covering said pin-opening over said first surface of said board.

9. The pin locking and unlocking means of claim 8 further comprising:

an inner module container for containing said board therein; and said inner module container further includes a plurality of pin access openings for receiving a plurality of cable pins passing through said outer container for disposing in said pin-opening on said board.

10. The pin locking and unlocking means of claim 9 wherein:

said inner module container further includes ground contact means disposed on an outer surface of said inner module container for contacting said outer container which contains said inner module container and for providing a ground voltage to said inner module container.

11. The pin locking and unlocking means of claim 10 wherein:

said ground contact means on said outer surface of said inner module container is disposed near said pin access openings whereby shielding and de-coupling effects are provided by a ground contact between said ground contact means and said outer container.

* * * * *